US009167345B2

(12) United States Patent
Ma

(10) Patent No.: US 9,167,345 B2
(45) Date of Patent: Oct. 20, 2015

(54) METHOD AND DEVICE OF CHANNEL EQUALIZATION AND BEAM CONTROLLING FOR A DIGITAL SPEAKER ARRAY SYSTEM

(75) Inventor: Dengyong Ma, Suzhou (CN)

(73) Assignee: SUZHOU SONAVOX ELECTRONICS CO., LTD., Suzhou (CN)

( * ) Notice: Subject to any disclaimer, the term of this patent is extended or adjusted under 35 U.S.C. 154(b) by 665 days.

(21) Appl. No.: 13/465,282

(22) Filed: May 7, 2012

(65) Prior Publication Data

US 2013/0108078 A1 May 2, 2013

(30) Foreign Application Priority Data

Oct. 27, 2011 (CN) .......................... 2011 1 0331100

(51) Int. Cl.

*H03G 5/00* (2006.01)
*H04R 1/40* (2006.01)
*H03G 3/00* (2006.01)
*H04R 5/02* (2006.01)
*H04R 3/12* (2006.01)
*H04R 3/04* (2006.01)

(52) U.S. Cl.

CPC .. *H04R 3/12* (2013.01); *H04R 3/04* (2013.01); *H04R 1/403* (2013.01); *H04R 2201/403* (2013.01); *H04R 2203/12* (2013.01); *H04R 2430/20* (2013.01); *H04R 2430/23* (2013.01)

(58) Field of Classification Search

CPC ........... H04R 2203/12; H04R 2430/20; H04R 2430/25; H04R 3/12; H04R 1/403; H04R 3/04; H04R 2201/403; H04R 2430/23
USPC .................................... 381/103, 97, 107, 305
See application file for complete search history.

(56) References Cited

U.S. PATENT DOCUMENTS 5,982,317 A * 11/1999 Steensgaard-Madsen .... 341/143
7,577,260 B1 * 8/2009 Hooley et al. ................... 381/77
2003/0016152 A1 * 1/2003 Takeda et al. ................. 341/144
2007/0263889 A1 * 11/2007 Melanson ..................... 381/300
2010/0239101 A1 * 9/2010 Okamura et al. ............ 381/71.1

* cited by examiner

*Primary Examiner* — Davetta W Goins
*Assistant Examiner* — Daniel Sellers
(74) *Attorney, Agent, or Firm* — Nixon & Vanderhye P.C.

(57) ABSTRACT

A method and device of channel equalization and beam controlling for a digital speaker array system includes (1) converting digital format; (2) performing channel equalization; (3) controlling beam-forming; (4) performing multi-bit Σ-Δ modulation; (5) performing thermometer code conversion; (6) performing dynamic mismatch-shaping processing; and (7) extracting the channel information to send to the digital power amplifier and drive the array sound. A device includes a sound source, a digital converter, a channel equalizer, a beam-former, a Σ-Δ modulator, a thermometer coder, a dynamic mismatch shaper, an extraction selector, a multi-channel digital power amplifier and a speaker array. Each unit connects to each other serially.

24 Claims, 9 Drawing Sheets

| Parameter name | Ideal parameter | CSD transformation | CSD value |
|---|---|---|---|
| a1、b1 | 0.2065 | $2^{-2}-2^{-5}-2^{-6}$ | 0.2031 |
| a2、b2 | 0.2109 | $2^{-2}-2^{-5}-2^{-7}$ | 0.2109 |
| a3、b3 | 0.2289 | $2^{-2}-2^{-8}-2^{-6}$ | 0.2305 |
| a4、b4 | 0.2838 | $2^{-2}+2^{-9}+2^{-5}$ | 0.2832 |
| a5、b5 | 0.4656 | $2^{-1}-2^{-8}-2^{-5}$ | 0.4648 |
| b6 | 1 | | |
| c1 | 0.1205 | $2^{-3}-2^{-8}-2^{-11}$ | 0.1206 |
| c2 | 0.2904 | $2^{-2}+2^{-5}+2^{-7}$ | 0.2891 |
| c3 | 0.5926 | $2^{-1}+2^{-4}+2^{-5}$ | 0.5938 |
| c4 | 1.3746 | $2^{0}+2^{-2}+2^{-3}$ | 1.3750 |
| c5 | 3.8554 | $2^{2}-2^{-6}-2^{-3}$ | 3.8594 |

Fig. 14

METHOD AND DEVICE OF CHANNEL EQUALIZATION AND BEAM CONTROLLING FOR A DIGITAL SPEAKER ARRAY SYSTEM

This application is claims priority to CN 201110331100.9 filed 27 Oct. 2011, the entire contents is hereby incorporated by reference.

FIELD OF THE INVENTION

The present invention relates to a method and device for channel equalization and beam controlling, particularly to a method and device of channel equalization and beam controlling for a digital speaker array system.

DESCRIPTION OF THE RELATED ART

With the rapid development of the large scale integrated circuit and the digital technology, the inherent defects of the conventional analog speaker system are becoming more and more obvious in power dissipation, volume and weight, as well as in the transmission, storage, and processing of signals and the like. In order to overcome these defects, the research and development of the speaker system is gradually heading for the low power dissipation, small outline, digitization and integration. As the emergence of the class-AD digital power amplifier based on PWM modulation, the digitization course of the speaker system has been advanced to the power amplifier part, however, the high quality inductors and capacitors of big volume and high price are still required for the post-stage circuit of the digital power amplifier to passively simulate low-pass filtering to eliminate high frequency carrier components, so as to further demodulate the original analog signals.

In order to decrease the volume and cost of the digital power amplifier and achieve more integration, US patents (US 20060049889A1, US 20090161880A1) disclose digital speaker systems based on PWM modulation and class-BD power amplification technology. However, there exist two significant disadvantages in the digital speaker systems based on PWM modulation: (1) the coding scheme based on PWM modulation has inherent nonlinear defects due to modulation structure thereof, making the coded signals generate nonlinear distortion components in the desired band, while if a further linearization means is employed to improve it, the realization difficulty and complexity of the modulation manner will rise sharply; (2) Considering the realization difficulty of hardware, the over-sampling rate of the PWM modulation is low, generally in the frequency range of 200 KHz~400 KHz, making SNR (Signal to Noise Ratio) of the coded signals can not be further increased due to the limitation of the over-sampling rate.

Considering the defects of nonlinear distortion and the low over-sampling rate of PWM modulation technique in digital speaker system implementation, with the all-digital demand of the whole transmission link of signals, the china patent CN 101803401A discloses a digital speaker system based on multi-bit Σ-Δ modulation. In such a system, the high-bit PCM code is converted into unary code vector as a control vector for controlling the on-off action of the speaker array, by multi-bit Σ-Δ modulation and thermometer coding techniques, and the high-order harmonic components of the spatial domain synthetic signals arisen from frequency response difference between array elements are eliminated by dynamic mismatch shaping technique; though the system disclosed in the patent realizes the all-digitalization of the whole transmission link of signals, and reduces the total harmonic distortion ratio of the spatial domain synthetic signals by dynamic mismatch shaping technique, however, the dynamic mismatch shaping technique does not have equalization effect on the frequency response fluctuation in audio band of channel, thus, a great deviation between the system restoration signal spectrum and the sound source signal real spectrum is caused by the frequency response fluctuation in band of each channel, thus there is a great difference between the restoration sound field and the real sound field, making the digital replay system can not reproduce the real sound field effect of the original sound source. Additionally, this frequency response fluctuation in band of each channel also causes the lower stability and slower convergence rate of various self-adaptive array beam-forming algorithms, thereby leading to the robustness of the self-adaptive array beam-forming algorithms becoming poor.

Now the beam steering method based on the channel delay regulation disclosed in china patent CN 101803401A is a simple method of beam-forming, which only regulates the phase information of the transmission signals of each channel of array, without considering the magnitude regulation of transmission signals of each channel. The beam control ability provided in the method is weak, and a certain beam steering ability is provided only in the environment adjacent to free field in the method, in some cases, such method based on delay control can not accomplish the steering control of multiple beams, when it is needed for the digital system to generate multiple directional beams. Further, in practical application, there are generally many scattering boundaries, this makes the transmitted signals contain a lot of multi-path scattering signals besides the direct sound. In such reverberant environment of obvious multi-path scattering, the better beam directional control can not be achieved only relying on the steering method of channel delay control. Consequently, considering the problem of beam directional control of digital speaker array in reverberant environment, it is needed to look for a forming method of complicated beam having the anti-reverberation ability, to simultaneously regulate the magnitude and phase of the transmission signals of each channel, thus achieving the desired control effect of sound field.

Currently, almost all the digital array systems based on multi-bit Σ-Δ modulation rely on the mismatch-shaping technique to eliminate the frequency response difference between multiple channels, however, such correction method for frequency response difference of channels only adapts to the correction of a little frequency response deviation, and the ability to correct phase deviation of which is quite weak. In addition, the mismatch-shaping technique has no equalization effect on the frequency response fluctuation in band of each channel, while the frequency response fluctuation of these channels would bring into the timbre ingredient variation of the restoration sound field, thus it is difficult to ensure the full recovery of the sound field. The beam controlling method employed in the conventional digital speaker arrays is a simple method of channel delay control, and such method only adapts to the ideal environment of free sound field, the method will not be suitable when a lot of multi-path interferences emerge in sound field due to reflection or scattering. In some applications, the method based on delay control can not achieve the sound field control effect of multiple beams, when it is needed for the arrays to generate multiple directional beams.

Considering the defects of the existing digital speaker array system based on multi-bit Σ-Δ modulation in channel equalization and beam controlling, a more effective method of channel equalization and beam controlling is needed to satisfy the application demand of digital speaker array system based on Σ-Δ modulation in frequency band flatness and beam directivity, and it is necessary to further make a digital speaker array system device having channel equalization and beam controlling functionalities.

SUMMARY OF THE INVENTION

In order to overcome the defects of digital speaker system in channel equalization, the present invention provides a method of channel equalization and beam controlling for a digital speaker array system, as well as a digital speaker system device having channel equalization and beam controlling functionalities.

For the foregoing purpose, the invention provides a method of channel equalization and beam controlling for a digital speaker array system, which comprises the following steps:

(1) Converting digital format, to convert the signals into digital signals based on PCM coding;

(2) Performing channel equalization;

(3) Controlling beam-forming;

(4) Performing multi-bit Σ-Δ modulation;

(5) Performing thermometer code conversion, to convert the low-bit PCM coded signals with a bit-width of M into unary code vectors of digital power amplifier and transducer load corresponding to $2^M$ transmission channels;

(6) Performing dynamic mismatch-shaping processing, to reorder the thermometer coded vectors, and (7) Extracting the channel information, to send to digital power amplifier and drive load sound.

Further, the digital format conversion in step (1) can be directed to analog and digital signals. For the analog signals, the signals should be converted into digital signals based on PCM coding by analog-to-digital conversion, before being converted into PCM coded signals meeting the requirements of parameters according to designated bit-width and parameter demand of sampling rate. For the digital signals, the signals are converted into PCM coded signals meeting the requirements of parameters according to designated bit-width and parameter demand of sampling rate.

Preferably, for the channel equalization processing in step (2), the parameters of the equalizer can be achieved according to measuring method. Provided that the number of elements is N, the quantity of measuring points in desired location is M, and the elements emit the white noise signals s(t), the impulse response $h_{i,j}$ from the element channel to the desired measuring location point can be calculated by obtaining received signals r(t) in the measuring point, wherein i represents the index number of the element No. i, and j represents the index number of the measuring point No. j in desired region. Provided that all impulse responses $h_{i,j}|_{1\le j\le M}$ from the element No. i to all measuring points have been calculated, then the average impulse response $$\bar{h}_i = \sum_{j=1}^{M} w_j h_{i,j}$$

from the element No. i to the desired region can be obtained by a weighted fitting method, wherein $w_j$ represents the weighted vector of frequency response from the element No. i to the measuring point No. j. Then the inverse filter response $\bar{h}_i^{-1}$ of the average impulse response $\bar{h}_i$ can be calculated according to the estimation algorithm of inverse filter. Finally, the convolution result of the average impulse response $\bar{h}_1$ from the first element to the desired location and the inverse filter response thereof $\bar{h}_1^{-1}$ selected as the reference vector hr $\bar{h}_r=\bar{h}_1*\bar{h}_1^{-1}$, then the inverse filter response $\bar{h}_i^{-1}$ ($2\le i\le N$) of the residual element channels is compensated by setting the compensation factor $h_c$, the convolution result $\bar{h}_{i,r}=\bar{h}_i*\bar{h}_{i,c}^{-1}$ of the compensation result $\bar{h}_{i,c}^{-1}=h_c*\bar{h}_{i-1}$ and the average impulse response $\bar{h}_i$ completely equals to the reference vector $\bar{h}_r$, thereby obtaining the response vector of the equalizer as follows:

$$h_{i,eq} = \begin{cases} \bar{h}_1^{-1}, & i = 1 \\ \bar{h}_{i,c}^{-1}, & 2 \le i \le N \end{cases}$$

Further, for the beam-forming control in step (3), the channel weight coefficient of the beam-former can be calculated by a normal method of beam-forming. Provided that the number of the array elements is N, the steering vector of spatial domain thereof is:

$$a(\theta)=[a_1(\theta)a_2(\theta)\ldots a_N(\theta)]^T.$$

The desired beam configuration of the spatial domain is:

$$D(\theta) = \begin{cases} 1, & \theta_1 \le \theta \le \theta_2 \\ 0, & \text{others.} \end{cases}$$

Provided that the array weight coefficient vector to be calculated is $w=[w_1\, w_2 \ldots w_N]^T$, then the calculation formula of the array weight coefficient can be obtained by least square criterion as follows:

$$\hat{w} = \underset{w}{\operatorname{argmin}} \int_{\theta_1}^{\theta_2} \|w^T a(\theta) - D(\theta)\|^2 \, d\theta = \left(\int_{\theta_1}^{\theta_2} a(\theta)a(\theta)^T \, d\theta\right)^{-1} \int_{\theta_1}^{\theta_2} D(\theta)a(\theta) \, d\theta.$$

The transmission signals of each channel are regulated in magnitude and phase by utilizing the array weighted vector, thereby steering the spatial domain emitting acoustic beam of the array to the desired region. Further, the process of multi-bit Σ-Δ, modulation in step (4) is as follows: firstly the high-bit PCM codes after equalization processing are subjected to interpolation filtering by an interpolation filter in terms of the designated over-sampling factor, to obtain over-sampling PCM coded signals; and then the noise energy within audio bandwidth is pushed out of the audio band by the Σ-Δ, modulation processing, to ensure the system has high enough SNR in band. While the original high-bit PCM codes are converted into low-bit PCM codes by the Σ-Δ, modulation processing, and the bit number of the PCM codes thereof is reduced.

Preferably, the multi-bit Σ-Δ, modulation in step (4) performs the noise shaping processing on the over-sampling signals output from the interpolation filter by utilizing various existing Σ-Δ, modulation methods, such as Higher-Order Single-Stage serial modulation method or Multi-Stage (Cascade, MASH) parallel modulation method, to push the noise energy out of band and further ensure the system has high enough SNR in band.

Further, the thermometer code conversion in step (5) is to convert the low-bit PCM coded signals with a width of M into unary code vectors of digital power amplifier and transducer load corresponding to $2^M$ transmission channels. The code of each digit of the unary code vectors will be sent to the corresponding digital channel. The code of each digit has two level states of "0" or "1" at any time, wherein on the "0" state the transducer load will be turned off while on the "1" state the transducer load will be turned on. The thermometer coding operation is to assign the coded information to multiple transducer load channels, thereby bringing the transducer load to the signal coding flow, and achieving the digital coding and digital switch control of the transducer array. Further, the dynamic mismatch-shaping processing in step (6) is to reorder the thermometer coded vectors, to further optimize the data allocation scheme of the unary code vectors and eliminate the nonlinear high-order harmonic distortion components of the spatial domain synthetic signals arisen from the frequency response difference between array elements.

Further, the dynamic mismatch-shaping in step (6) shapes the nonlinear harmonic distortion spectrum arisen from the frequency response difference between array elements, by utilizing various existing shaping algorithms such as DWA (Data-Weighted Averaging), VFMS (Vector-Feedback mismatch-shaping) and TSMS (Tree-Structure mismatch shaping) algorithms, to reduce the magnitude of the harmonic distortion in band and push the power to the high frequency section out of band, thereby reducing the magnitude of harmonic distortion in band and improving the sound quality of the Σ-Δ, coded signals.

Further, the channel information extraction in step (7) refers to performing the coded information distribution operation to each channel, and the process of signals processing is as follows: firstly the dynamic mismatch shaper of each channel performs the dynamic mismatch-shaping processing to obtain reordered shaping vectors, and then a designated digit code is selected from the $2^M$ digits of the shaping vector of each channel according to a certain extraction selection criterion. To ensure complete restoration of the information, the number of the digit selected of one channel should be different from that of other channels, and all the digit order numbers selected of all $2^M$ channels completely contain the digit order of 1 to $2^M$ During the course of selecting operation in channel information extraction, generally the digit selection is carried out by a simple rule, i.e., in No. i channel, No. i digit coded information is selected from the shaping vectors thereof. After the selection and combination of the bits of the channels, the equalization and beam weighted processing preset in the multiple array element channels is succeeded effectively, thereby providing an effective realization way for the equalization and directivity controlling of the digital array.

Preferably, the load in step (7) can be a digital speaker array comprising multiple speaker units, or a speaker unit having multiple voice-coil windings, or alternatively a digital speaker array comprising a plurality of speaker units of multiple voice-coils.

The present invention also provides a digital speaker array system having channel equalization and beam controlling functionalities, which comprises: A sound source, which is the information to be played by the system; A digital converter, which is electrically coupled to the output end of the sound source, for converting the input signals into high-bit PCM coded signals with a bit-width of N and a sampling rate of $f_s$;

A channel equalizer, which is electrically coupled to the output end of the digit converter, for performing an inverse filtering equalization on frequency response of each channel to eliminate the frequency response fluctuation in band of the channel;

A beam-former, which is electrically coupled to the output end of the channel equalizer, for controlling the spatial domain emitting shape of the beam of speaker array and creating the sound field distribution characteristics such as 3D stereo sound field, virtual surround sound field and directional sound field and the like, to achieve the purpose of playing special sound effect; A Σ-Δ modulator, which is electrically coupled to output end of the beam-former, for accomplishing over-sampling interpolation filtering and multi-bit Σ-Δ code modulation, and obtaining low-bit PCM coded signals with a reduced bit-width; A thermometer coder, which is electrically coupled to the output end of the Σ-Δ modulator, for converting the low-bit PCM coded signals into unary vectors which is equal in amount to the digital channels of the system, thereby digitizing the control vectors of the channel switch;

A dynamic mismatch shaper, which is electrically coupled to the output end of the thermometer coder, for eliminating the nonlinear harmonic distortion components of the spatial domain synthetic signals arisen from the frequency response difference between the array elements, reducing the magnitude of harmonic distortion components in band, and pushing the power of harmonic-frequency components to the high frequency section out of band, thereby reducing the magnitude of the harmonic distortion in band and improving the sound quality of Σ-Δ coded signals; anextraction selector, which is electrically coupled to the dynamic mismatch shaper, for extracting a certain digit coded information from the shaping vectors of each channel, and controlling the on/off control information of the channel;

A multi-channel digital amplifier, which is electrically coupled to the output end of the extraction selector, for amplifying power of the controlling coded signals of each channel, and driving the on/off action of the post-stage digital load; and A digital array load, which is electrically coupled to the output end of the multi-channel digital amplifier, for accomplishing the electro-acoustic conversion, and converting the digital electric signals of switch into air vibration signals in analog format.

Further, the sound source can be analog signals generated by various analog devices or digital coded signals generated by various digital devices. Preferably, the digital converter which can be compatible with the existing digital interface formats, may contain analog-to-digital converter, digital interface circuits such as USB, LAN, COM and the like, and interface protocol programs. Via the interface circuits and protocol programs, the digital speaker array system can interact and transmit information with other devices flexibly and conveniently. Meanwhile, the original input analog signals or digital sound source signals are converted into high-bit PCM coded signals with a bit-width of N and a sampling rate of $f_s$ by the processing of the digital converter.

Further, the channel equalizer can perform equalization processing in terms of the response parameters of inverse filtering in time domain or frequency domain, and eliminate the frequency response fluctuation in band of each channel, while the frequency response difference of each channel can be corrected, thus making the frequency response difference of each channel tend towards consistency.

Further, the beam-former performs weighted processing on the transmitted signals of each channel by utilizing the designed weighted vectors, to regulate the magnitude and phase information thereof, thereby making the spatial domain pattern of digital array in a complicated environment meet the desired design demand.

Preferably, the process of signal processing of the Σ-Δ, modulator is as follows: at first the PCM coded signals with a bit-width of N and a sampling rate of $f_s$ are subjected to over-sampling interpolation filtering in terms of the over-sampling factor $m_o$ to obtain the PCM coded signals with a bit-width of N and a sampling rate of $m_o f_s$, and then the over-sampling PCM coded signals with a bit-width of N are converted into low-bit PCM coded signals with a bit-width of M(M<N), thereby reducing the bit-width of the PCM coded signals.

Further, the Σ-Δ, modulator can perform noise shaping processing on the over-sampling signals output from the interpolation filter, according to the signal processing structures of various existing Σ-Δ, modulators, such as higher-order single-stage serial modulator structure or multi-stage parallel modulator structure, and push the noise energy out of band, to ensure the system has high enough SNR in band.

Preferably, the thermometer coder is used for converting the low-bit PCM coded signals with a bit-width of M into unary code signal vector of the digital amplifier and transducer load corresponding to $2^M$ channels. The coded information of each digit of the unary code vector is assigned to a corresponding digital channel, to bring the transducer load into the signal coding flow, thereby achieving digital coding and digital switch controlling for the transducer load.

Further, the dynamic mismatch shaper utilizes various existing shaping algorithms such as DWA (Data-Weighted Averaging), VFMS (Vector-Feedback mismatch-shaping) and TSMS (Tree-Structure mismatch shaping) algorithms to shape the nonlinear harmonic distortion spectrum arisen from the frequency response difference between array elements, to reduce the magnitude of the harmonic distortion components in band and push the power to the high frequency section out of band, thereby reducing the magnitude of harmonic distortion and improving the sound quality of the Σ-Δ coded signals.

Preferably, the extraction selector extracts according to a certain extraction rule the information of one digit from the shaping vectors of each channel of $2^M$ digital channels as the output coded information of the corresponding channel, for controlling the on/off action of post-stage transducer load. After the bit extraction and merging operation of the extraction selector, the operation of the equalizer response and channel directivity weighting vectors of the original multiple channels is achieved effectively, that ensures frequency response flatness of the digital array and controllability of the beam direction. Further, the multi-channel digital power amplifier send the switch signals output from the extraction selector to the MOSFET grid end of a full-bridge power amplification circuit. The on/off status of the circuit from the power source to load can be controlled by controlling the on/ff status of the MOSFET, thereby achieving the power amplification of the digital load.

Preferably, the digital array load can be a digital array comprising multiple speaker units, or a speaker unit of multiple voice-coils, or alternatively be a speaker array comprising speakers of multiple voice-coils. Each digital channel of the digital load may comprise one or more speaker units, or one or more voice-coils, or alternatively comprises multiple voice-coils and multiple speaker units. The array configuration of the digital load can be arranged according to the quantity of transducer units and the practical application demand, to form various array configurations.

The present invention has following advantages over the prior art:

A. The invention achieves the all-digitalization of the whole signal transmission link, the whole system of the invention consists of digital devices and thus facilitates to designing the integrated circuit highly, and the invention improves the work stability of the system, as well as decreases the power dissipation, volume and weight of the system. Also, the digital speaker array system provided in the invention can achieve data interchange with other digital system devices flexibly and conveniently, and can adapt to the digitization development demand better.

B. The multi-bit Σ-Δ modulation employed in the invention pushes the noise power to high frequency region out of band by noise shaping, thereby ensuring the demand of high SNR in band. The hardware realization circuits of this modulation technique are simple and low-priced, and have excellent immunity to the parameter deviations caused in the manufacturing process of the circuit elements.

C. The all-digital system of the invention has great anti-interference ability, and can work stably in the complicated environment of electromagnetic interference.

D. The dynamic mismatch shaping algorithm utilized in the invention can eliminate effectively the magnitude of the nonlinear harmonic distortion arisen from the frequency response difference between array elements and improve the sound quality of the system, therefore, the system of the invention has excellent immunity to the frequency response deviation between the transducer units.

E. The thermometer coding method applied in the invention can allocate corresponding unary code signals to each transducer unit, making each speaker unit (or each voice-coil) works in on/off status, while such alternative working status of on/off can avoid the overload distortion phenomenon of each speaker unit (or each voice-coil), thereby extending the lifetime of each speaker unit (or each voice-coil). Furthermore, the transducer can achieve higher electro-acoustic transforming efficiency and generate less heat by utilizing the on/off working way.

F. The digital power amplifying circuit applied in the invention sends the amplified switch signals to speaker and further control the on/off action of the speaker, without adding any inductors and capacitors of great volume and high-priced in the post-stage circuit of the digital power amplifier for the analog low-pass processing, thus decreasing the volume and cost of the system. Further, for the piezoelectric transducer load with capacitive characteristic, generally it is needed to add inductor for the impedance matching to increase the output acoustic power of the piezoelectric speaker, and the impedance matching effect of applying digital signals to transducer end is superior to the same of applying analog signals to transducer end.

G. The thermometer coding scheme utilized in the invention makes the allocated unary code signals of each set of array elements only contain part information of the original sound source signals, thus, the sound source information can not be completely restored simply relying on the emitted information from single set of array elements, therefore, the full restoration of the sound source information can be achieved only by combining the synthetic effects of the spatial domain emitting sound field of all sets of array elements. Further, the restored information obtained by the above combining way has spatial domain directivity and has the maximum SNR in the symmetry axis of array, and the SNR reduces as the distance to the axis increasing.

H. The channel equalization method of the invention can keep the frequency response in band flat and correct the frequency response difference between channels; this makes the sound source signal spectrum restored by system and the real spectrum of the original sound source signal tend awards consistency, thereby ensuring the digital replay system truly reproduces the sound field effect of the original sound source. Meanwhile, the flatness of the frequency response in band of each channel and the consistency of the frequency response in band between channels resulted from the method provides a favorable support for the better stability, the higher convergence rate and the better robustness of various self-adaptive algorithms.

I. The channel equalization method based on data extraction selection provided in the invention can efficiently suppress the frequency response fluctuation of each channel and improve the restoration quality of the sound field of the digital system, as well as eliminate the great frequency response difference between channels, therefore, the frequency response difference between channels can be compensated in a great degree after the multi-channel equalization processing, and only a few residual deviations remain, while these residual deviations can be further efficiently corrected relying on the mismatch shaping algorithm, thereby making the ability of mismatch shaping algorithm to eliminate a few deviations can be brought into full play. The frequency response difference of array elements can be corrected efficiently via the channel equalization processing, thereby ensuring the various array beam controlling algorithms based on the coherent accumulation of array element channels can work efficiently. Such method of digital array beam-forming based on data extraction selection can efficiently improve the ability of the digital arrays to control the spatial sound field in complicated environment.

J. The beam controlling method applied in the invention ensures that the digital speaker array has better beam directivity in complicated environment, via the information combination way of extraction selection, the normal beam controlling method can be applied efficiently in the beam controlling of the digital array, which provides a effective implementation way for the generation of the special sound field effects in practical environment, such as 3D stereo sound field, virtual surround sound field, and directional sound field and the like.

K. In the data extraction selection method employed in the invention, the conventional channel equalization and beam-forming algorithms based on PCM coding format can be applied directly in the digital array systems based on multi-bit Σ-Δ modulation, thereby creating a bridge between the conventional channel equalization and beam controlling algorithms and the digital array systems based on multi-bit Σ-Δ modulation, and ensuring the conventional algorithms can continue playing the role of channel equalization and beam steering effectively in array systems based on Σ-Δ modulation.

BRIEF DESCRIPTION OF THE DRAWINGS

FIG. 14 shows the values of the parameters utilized by the Σ-Δ modulator, according to one embodiment of the invention.

DETAILED DESCRIPTION OF THE INVENTION

The present invention will be described hereinafter with reference to the appended drawings. It is to be noted, however, that the drawings illustrate only typical embodiments of this invention and are therefore not to be considered limiting of its scope, for the invention may admit to other equally effective embodiments.

In the invention, firstly the sound source signals in the audio-frequency range are converted into high-bit PCM coded signals with a bit-width of N by a digital conversion interface. Then, the frequency response fluctuation in band of each channel is eliminated by inverse filtering the digital sound source signals of each channel utilizing the channel equalization technique, and the frequency response difference between channels is eliminated simultaneously. Subsequently, the signals of each channel after equalization is subject to weighted processing by the beam-forming technique, thereby making the array are directed to the desired spatial direction. And then the high-bit PCM coded signals with a bit-width of N are converted into low-bit PCM coded signals with a bit-width of M (M<N) by multi-bit Σ-Δ, modulation technique. Next, the PCM coded signals with a bit-width of M are converted into thermometer coded signals with a bit-width of $2^M$ by thermometer coding method, thereby forming unary code signals assigned to $2^M$ sets of transducer arrays. Then the unary code signals allocated to each set of arrays are subjected to dynamic mismatch shaping to eliminate the high-order harmonic components arisen from the frequency response difference of each set of arrays, and reduce the all harmonic distortion of the system, as well as improve the sound quality of the system. Then the bit information of one digit is extracted from the mismatch shaping vectors of each channel and sent to the digital amplifier of the channel, to form power signal and drive the on/off action of the digital load of the channel, the spatial sound fields emitted by the digital loads of all channels restore the original signals after superposition in some spatial predetermined region.

Figure 1:
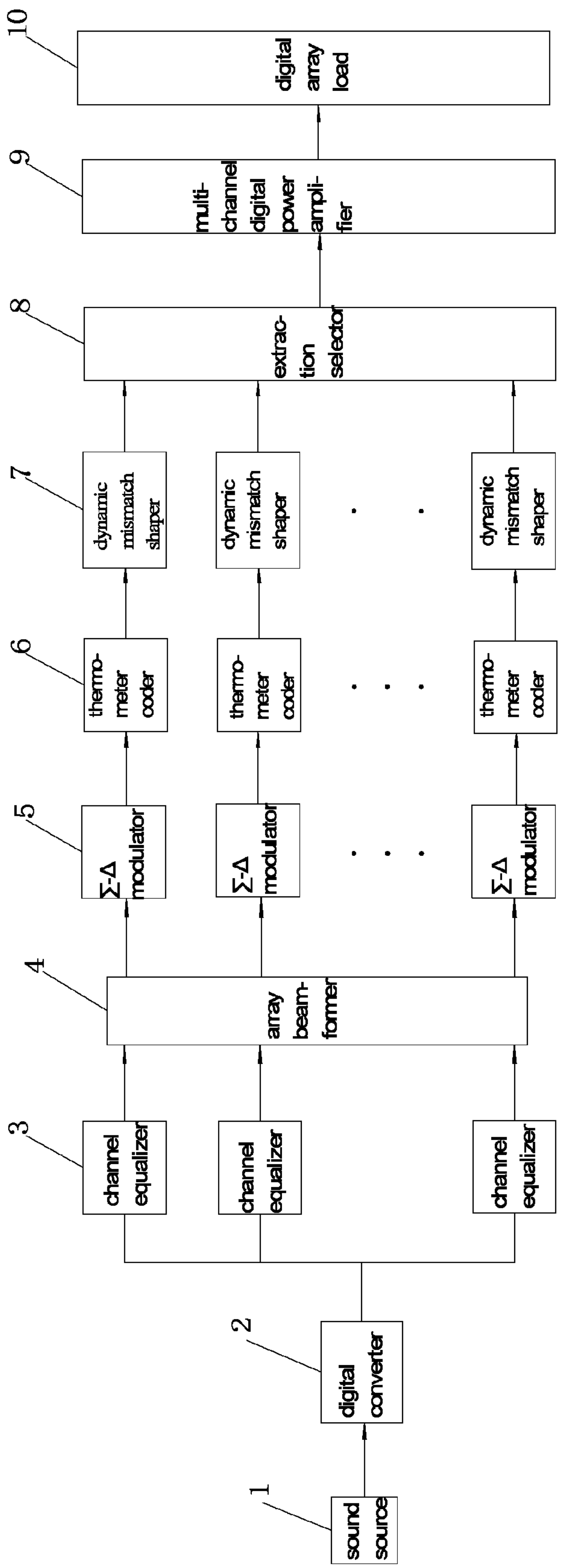
FIG. 1 is a block diagram illustrating the component modules of the digital speaker system device having channel equalization and beam controlling functionalities, according to the present invention.
Figure 2:
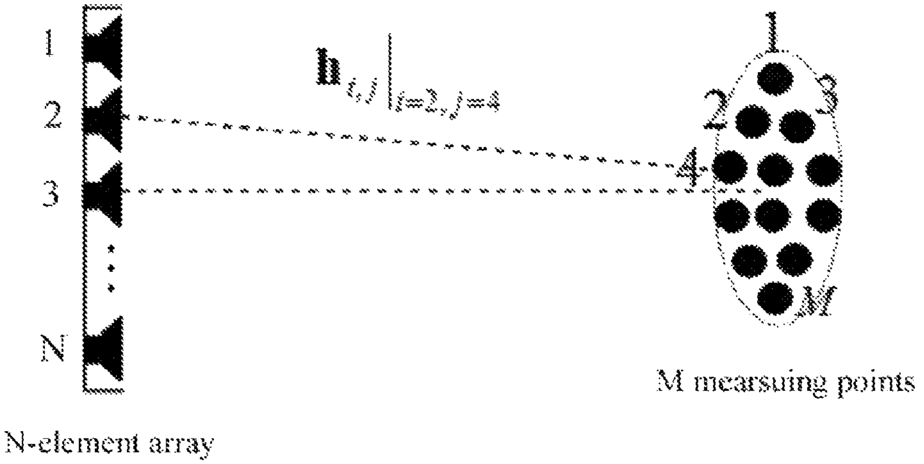
FIG. 2 is a schematic view illustrating the channel parameter measuring in the process of parameter estimation of channel equalization, according to the present invention.
Figure 3:
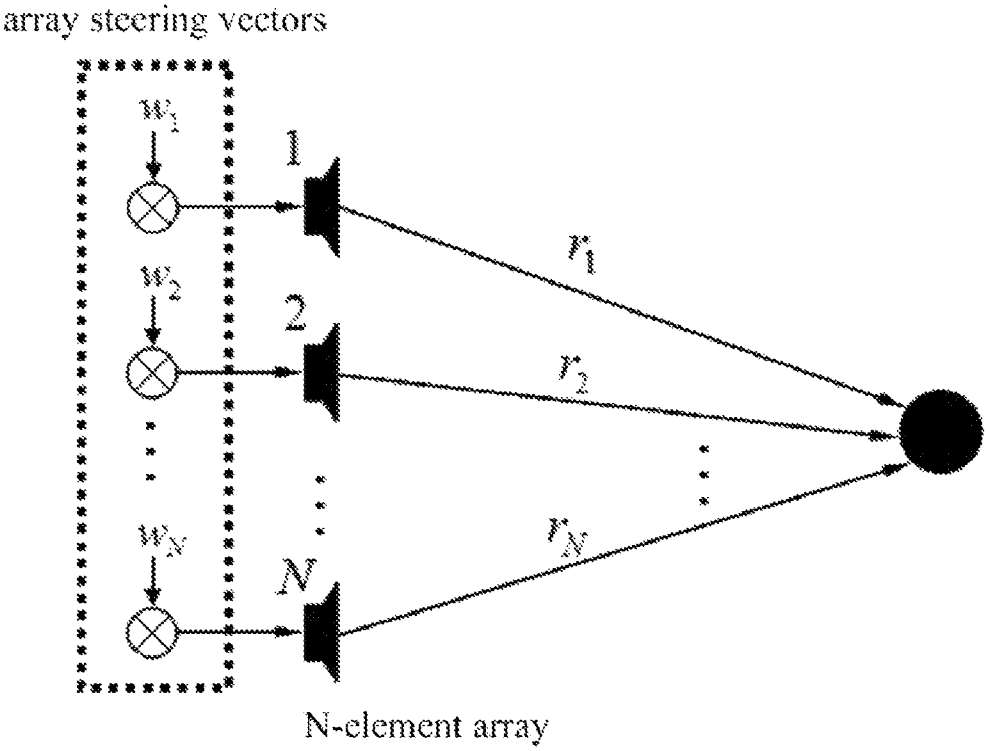
FIG. 3 is schematic view showing the channel weight vector loading in the process of beam controlling, according to the present invention.
Figure 4:
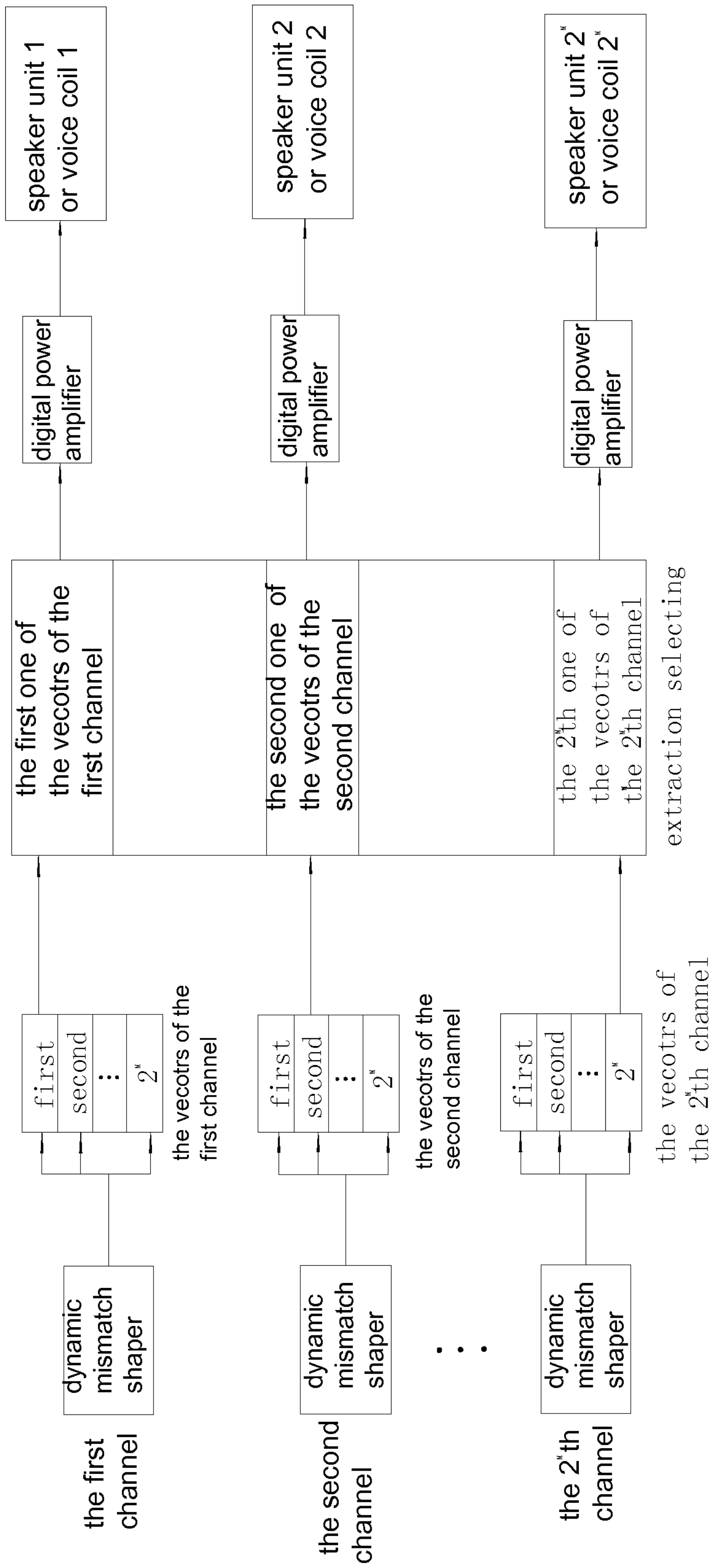
FIG. 4 is schematic view showing the extraction rule utilized in channel information extraction, according to the present invention.

As shown in FIG. 1, a digital speaker system device having channel equalization and beam controlling functionalities is provided according to the present invention, the main body of which comprises a sound source 1, a digital converter 2, a channel equalizer 3, a beam-former 4, a Σ-Δ, modulator 5, a thermometer coder 6, a dynamic mismatch shaper 7, a extraction selector 8, a multi-channel digital power amplifier 9 and a digital array load 10 and the like. Wherein the sound source 1 can use the sound source files in MP3 format stored in the hard discs of PCs and output in digital format via USB ports, and can use the sound source files stored in MP3 players and output in analog format, and can also use the test signals in audio-frequency range generated by signal source and output in analog format as well as.

The digital converter 2 is electrically coupled to the output end of the sound source 1, which contains two input interfaces of digital input format and analog input format. For the digital input format, by utilizing a USB interface chip typed PCM2706 of Ti Company, the files in MP3 format stored in PCs can be read real-time into FPGA chips typed Cyclone III EP3C80F484C8 through 12S interface protocol via USB port, with a bit-width of 16 and a sampling rate of 44.1 KHz. For the analog input format, by utilizing a analog-to-digital conversion chip typed AD1877 of Analog Devices Company, the analog sound source signals can be converted into PCM coded signals with a bit-width of 16 and a sampling rate of 44.1 KHz, and can also be read real-time into FPGA chips through 12S interface protocol.

Figure 5:
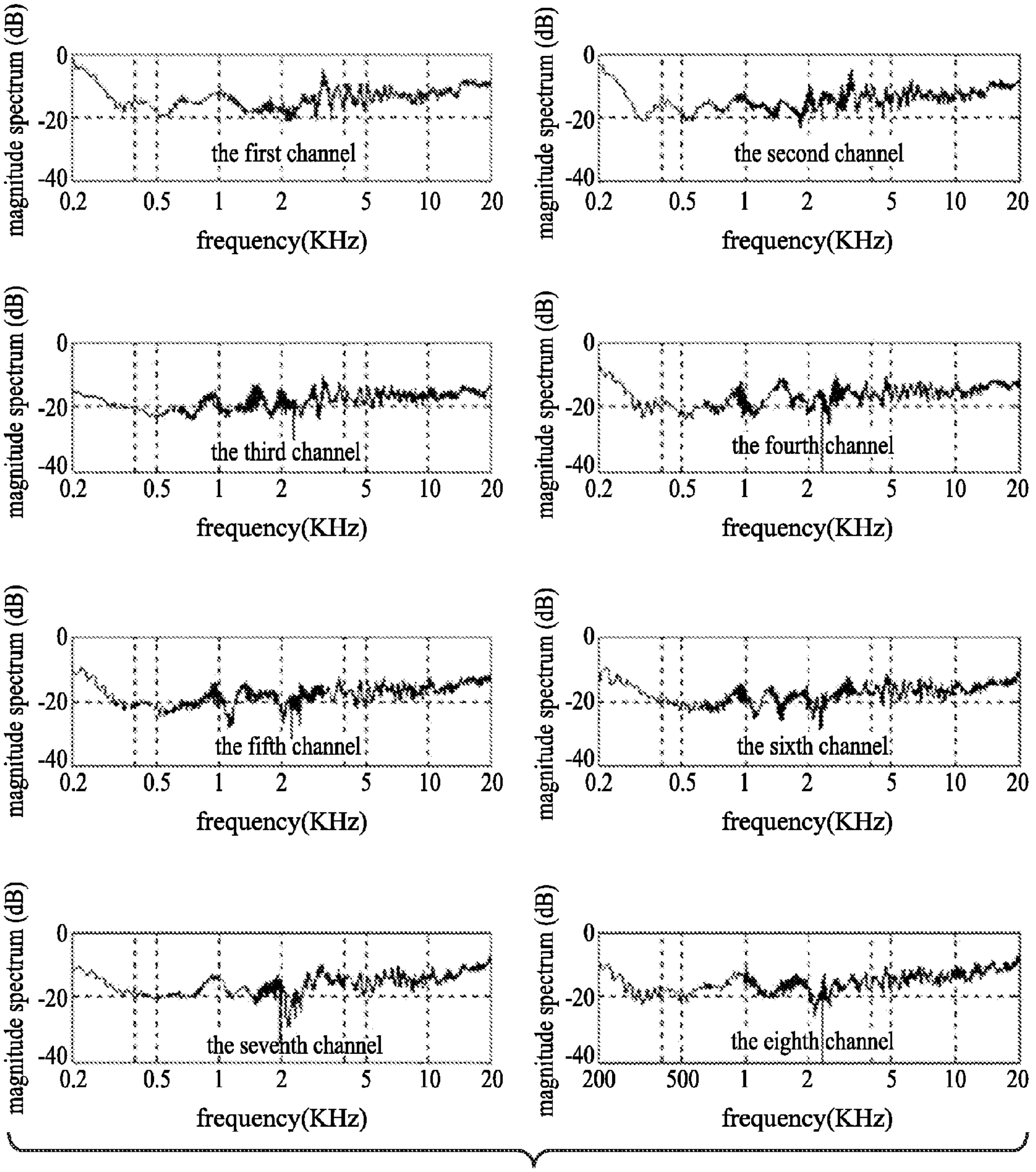
FIG. 5 is a graph illustrating the magnitude spectrums of the inverse filters utilized in the process of channel equalization, according to one embodiment of the invention.

The channel equalizer 3 is electrically coupled to output end of the digital converter 2, which calculates the parameters of inverse filter of each channel by measuring. The magnitude spectrum graphs of inverse filters of channels 1 to 8 are shown in FIG. 5, the PCM signals after equalization with a bit-width of 16 and a sampling rate of 44.1 KHz are obtained by performing equalization processing on the channels in terms of the parameters of inverse filters.

The beam-former 4 is electrically to output end of the channel equalizer 3, which calculates weighted vectors of the 8-element array according to the desired beam pattern, then loads the calculated weighted vectors to the transmission signals of each array channel by multiplier unit, i.e., the PCM signals after equalization with a bit-width of 16 and a sampling rate of 44.1 KHz, thereby forming the multi-channel PCM signals with orientation weighted regulation.

Figure 6:
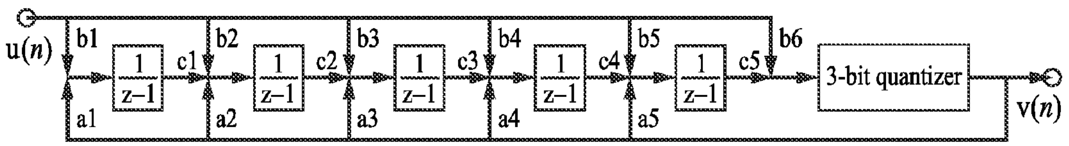
FIG. 6 is a flow chart showing the signal processing of the fifth-order CIFB modulation structure utilized by the Σ-Δ modulator, according to one embodiment of the invention.

The Σ-Δ, modulator 5 is electrically coupled to the output end of the beam-former 4, the PCM coded signals of 44.1 KHz, 16-bit are processed with a 3-level up-sampling interpolation inside the FPGA chip, wherein the first level interpolation factor is 4, and the sampling rate is 176.4 KHz, the second level interpolation factor is 4 and the sampling rate is 705.6 KHz, while the third level interpolation factor is 2 and the sampling rate further increases to 1411.2 KHz. After the 32 times interpolating, the original signals of 44.1 KHz, 16-bit are converted into the over-sampling PCM coded signals of 1.4112 MHz, 16-bit. Then the over-sampling PCM coded signals of 1.4112 MHz, 16-bit are converted into PCMb coded signals of 1.4112 MHz, 3-bit by 3-bit Σ-Δ modulation. As shown in FIG. 6, in this embodiment, the Σ-Δ modulator 5 is provided with a fifth-order CIFB (Cascaded Integrators with Distributed Feedback) topology construction. The coefficient of the Σ-Δ modulator 5 is shown in table 1. In order to save hardware resource and reduce the realization cost, the constant multiplication operation is generally substituted by the shift addition operation inside the FPGA chip, and the parameters of the Σ-Δ modulator are depicted in CSD code.

Figure 7:
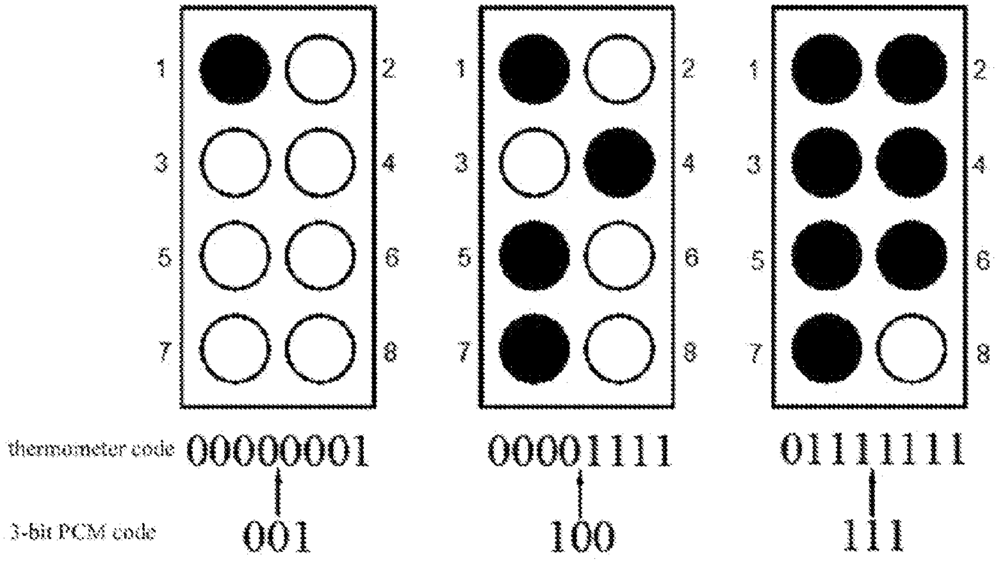
FIG. 7 is schematic view illustrating the on-off control of the thermometer coded vector, according to one embodiment of the invention.

The thermometer coder 6 is electrically coupled to the output end of the Σ-Δ modulator 5, which converts the Σ-Δ modulation signals of 1.4112 MHz, 3-bit into unary codes of 1.4112 MHz, 8-bit by thermometer coding. As shown in FIG. 7, when the PCM code of 3-bit is "001" and the converted thermometer code thereof is "00000001", the code is used for controlling one element being on status and the other 7 elements being off status of the transducer array. When the PCM code of 3-bit is "100" and the converted thermometer code thereof is "00001111", the code is used for controlling four elements being on status and the other 4 elements being off status of the transducer array. While when the PCM code of 3-bit is "111" and the converted thermometer code thereof is "01111111", the code is used for controlling seven elements being on status and only the residual one element being off status of the transducer array.

Figure 8:
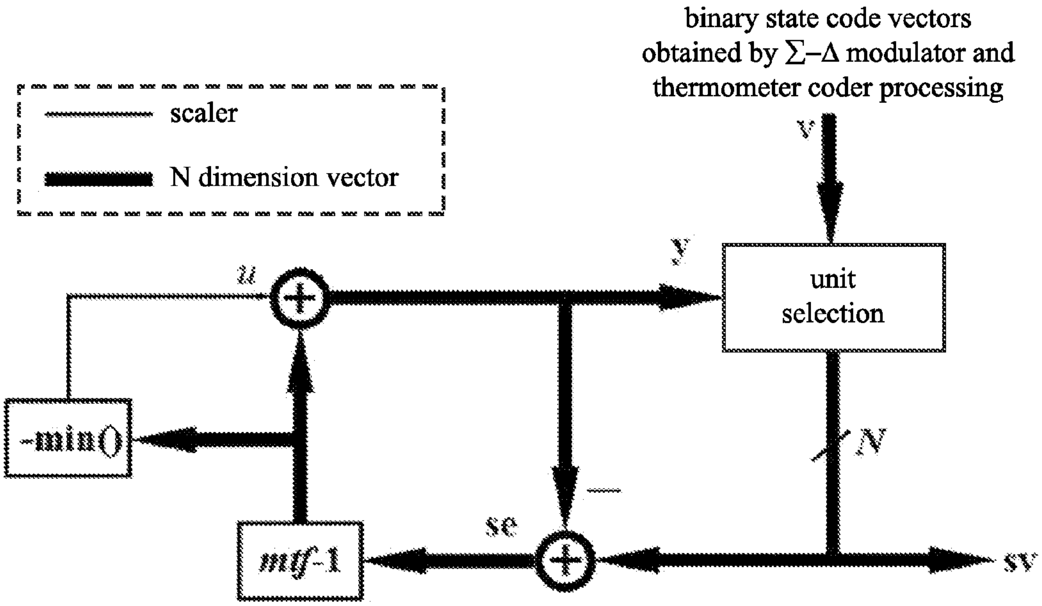
FIG. 8 is a flow chart showing the VFMS mismatch shaping algorithm utilized by the dynamic mismatch shaper, according to one embodiment of the invention.

The dynamic mismatch shaper 7 is electrically coupled to the output end of the thermometer coder 6, which is used for eliminating the nonlinear harmonic distortion components arisen from the frequency difference between array elements. The dynamic mismatch shaper 7 reorders the 8-bit thermometer codes according to the optimum criteria of least nonlinear harmonic distortion components, thereby determining the code assigning way to the 8 transducers. As shown in FIG. 7, when the thermometer code is"00001111", after the reordering of the dynamic mismatch shaper 7, it will be determined that the transducer elements 1, 4, 5, 7 are allocated code "1" and the transducer elements 2, 3, 6, 8 are allocated code "0", and thus the transducer elements 1, 4, 5, 7 will be on and the transducer elements 2, 3, 6, 8 will be off by this assigning way. Performing the on/off control of the transducer array according to the code allocation way will make the synthesized signals of the sound fields emitted by array contain the least harmonic distortion components. In this embodiment, the dynamic mismatch shaper utilizes VFMS (Vector-Feedback mismatch shaping) algorithm, the process of signal processing is shown in FIG. 8, wherein the heavy line represents the N dimension vector and the thin line represents scalar, the input signal V is N dimension code vector processed by the Σ-Δ, modulator and the thermometer coder, in which the code vector contains v "1" status and N−v "0" status, and the output signal is N dimension vector processed by the mismatch shaper, the order of the "1" status and the "0" status of the output vector is adjusted by the mismatch shaping processing, but the numbers of the "1" status and the "0" status still remain, moreover, each element of the vectors controls the on/off action of the corresponding channel of array element in array according to the status thereof. Via certain selection scheme, the unit selection module ensures the error arisen from frequency difference has better shaping effect on frequency spectrum, wherein −min( ) module represents selecting the element of minimum number value from the N dimension vectors and negating it, the scalar element obtained by −min( ) module operation is u, and mtf represents the mismatch shaping function, the general form of which is $(1-z^{-1})^M$ and M is the order, the order of the mismatch shaper utilized in this embodiment is 2-order. According to the flow chart of signal processing of FIG. 8, the expression of the output vector after mismatch shaping processing is obtained as follows:

$$sv=u[1 1 \ldots 1]_{1\times N}+mtf(se),$$

Wherein se=sv−y. Provided that the N dimension vector $e_d$ represents the unconformity error between array units, and the sum of all elements of $e_d$ is 0, then the expression of the output sound signals of array obtained through the superposition of the output sound field of each array in the any spatial location by the speaker array is as follows:

$$\begin{aligned} x &= sv \times e_d \\ &= [u[1\ \ 1\ \ \ldots\ \ 1]_{1\times N} + mtf(se)] \times e_d \\ &= u[1\ \ 1\ \ \ldots\ \ 1]_{1\times N} \times e_d + mtf(se) \times e_d \circ \\ &= u \times 0 + mtf(se) \times e_d \end{aligned}$$

Figure 9:
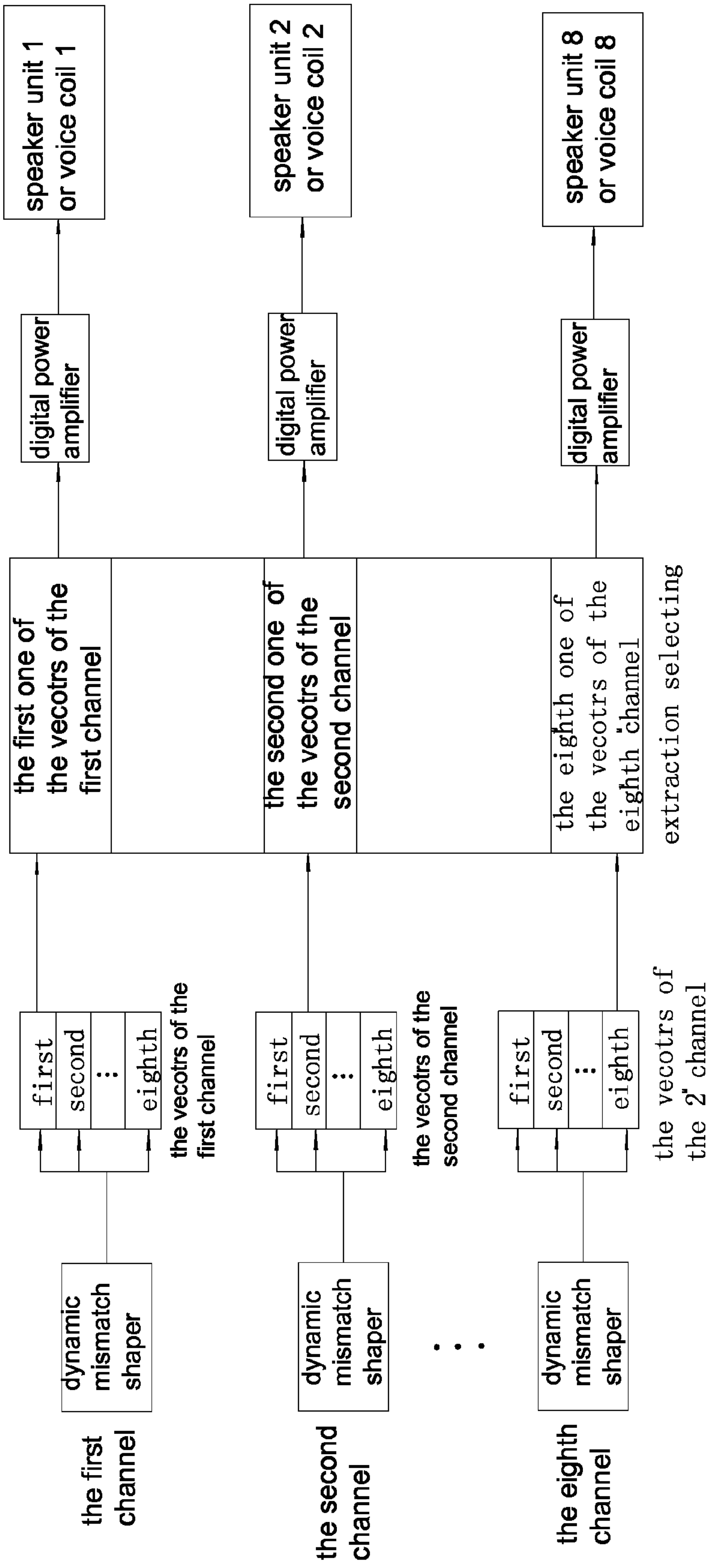
FIG. 9 is a schematic view showing the extraction rule utilized by the extraction selector, according to one embodiment of the invention.

It can be seen from the expression of the output sound signals of array that the shaping function mtf can shape the array error $e_d$, and the better shaping effect on the array error $e_d$ can be achieved when the better mismatch shaping function is selected. Within the FPGA chip, the harmonic components existing in the original Σ-Δ, coded signals are pushed to high frequency section out of band, thereby improving the sound quality of the sound source signals in band. The extraction selector 8 is electrically coupled to the output end of the dynamic mismatch shaper 7, which is used for extracting the digit from the shaping vectors of each channel to send to the post-stage circuit of the power amplifier and digital load. As shown in FIG. 9, each channel generates one unary code vector of 8-element by mismatch shaping processing, the extraction selector 7 will extract unary code signal of a corresponding digit for each channel as the input signal of the post-stage digital power amplifier, according to the rule of the ith channel extracting the ith digit of the shaping vector.

The multi-channel digital power amplifier 9 is electrically coupled to the output end of the extraction selector 8. In this embodiment, the digital power amplifier chip is a digital power amplifier chip typed TAS5121 from Ti Company, the response time of the chip is 100 ns order of magnitude, and the distortionless response of the unary code flow signal of 1.4112 MHz can be achieved. The differential input format is used in the input end of the power amplifier, one path of the output data from the dynamic mismatch shaper is output directly and the other path is output inversely, thus forming two paths of differential signals and sending them to the differential output end of the TAS5121 chip. While the differential output format is used in the output end of the power amplifier, the two paths of differential signals are applied to the positive and negative lead wires of the array element channel of single transducer.

Figure 10:
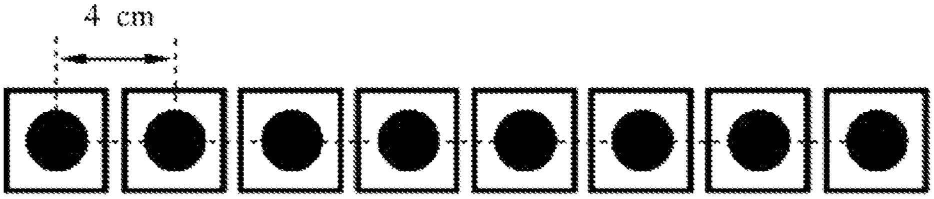
FIG. 10 is a schematic view showing the arrangement of the 8-element speaker array, according to one embodiment of the invention.

The digital array load 10 is electrically coupled to the output end of the multi-channel digital power amplifier 9. In this embodiment, the digital load unit is the speaker unit of full frequency band typed B2S produced by HuiWei Company, the frequency band range of the unit is 270 Hz~20 KHz, the sensitivity (2.83V/1 m) is 79 dB, the maximum power is 2 W, and the rated impedance is 8 ohm. As shown in FIG. 10, the digital load 8 is a speaker array of 8-element, the array comprises 8 said speaker units arranging according to a linear array way, the array elements are at 4 cm interval, and each speaker unit corresponds to a digital channel.

Figure 11:
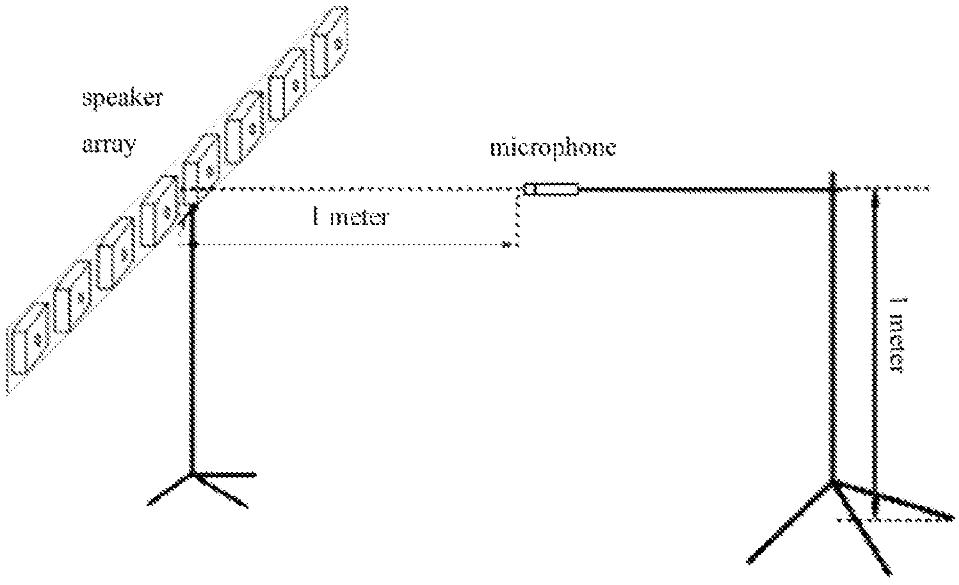
FIG. 11 is a schematic view showing the location configuration of the speaker array and the microphone unit, according to one embodiment of the invention.
Figure 12:
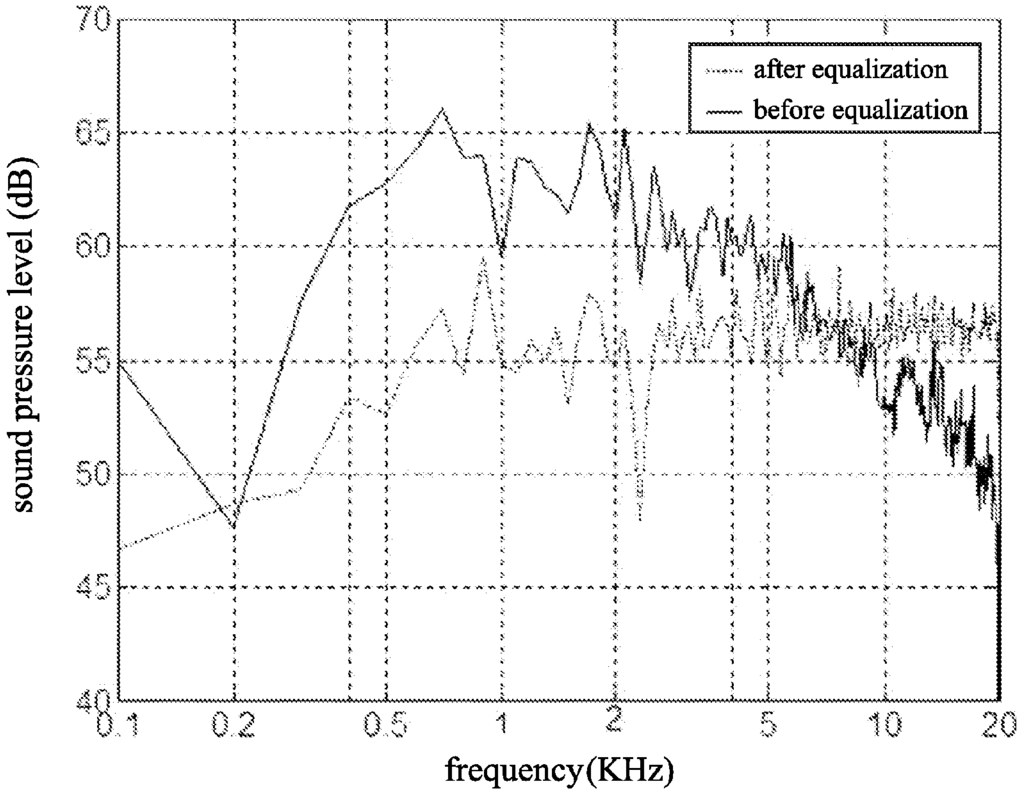
FIG. 12 is a comparison graph illustrating the magnitude spectrums of the system frequency response before and after equalization at the location point of one meter away from the array axis, according to one embodiment of the invention.

In the free space, provided that the arrangement of the speaker array and the microphone unit is shown in FIG. 11, according to the simulation experiment method, provided that the swept signals of 100 Hz-20 KHz are input into the digital speaker system device, the frequency response characteristic of the system is observed at the location point of one meter away from the axis of the speaker array. FIG. 12 shows the magnitude spectrum comparative graphs of the system frequency response at the location point of one meter away from the axis before and after applying the equalizer, the magnitude spectrum of the system frequency response has an obvious downtrend in the frequency range of 2 KHz~20 KHz before applying equalizer, and the magnitude spectrum of the system frequency response decreases from 65 dB to 45 dB, thus there is 20 dB magnitude difference here. After applying equalizer, the magnitude spectrum of the system frequency response still maintains 57 dB approximately in the frequency range of 2 KHz~20 KHz and presents flat spectrum characteristic, thereby ensuring the actual restoration of the synthetic signals of the system. It can be seen from the result of equalization that the equalizer response information of each channel can be succeeded effectively by utilizing the multi-channel bit information synthesis way of extraction selection, thereby ensuring the frequency response flatness of each channel.

The digital speaker array system based on channel equalization can eliminate effectively the frequency response fluctuation in audio band of each channel and correct the frequency response difference between channels, and thus ensures the system has the quite flat time-domain frequency characteristics, thereby ensuring the spectrum of the spatial synthetic signals of all channels can restore the real spectrum of the original sound source signals and the digital replay system can reproduce the sound field effect of the original sound source actually. Additionally, eliminating the frequency response fluctuation in audio band of each channel can ensure various self-adaptive spatial domain array beam-forming algorithms have the higher convergence rate and the better robustness.

Figure 13:
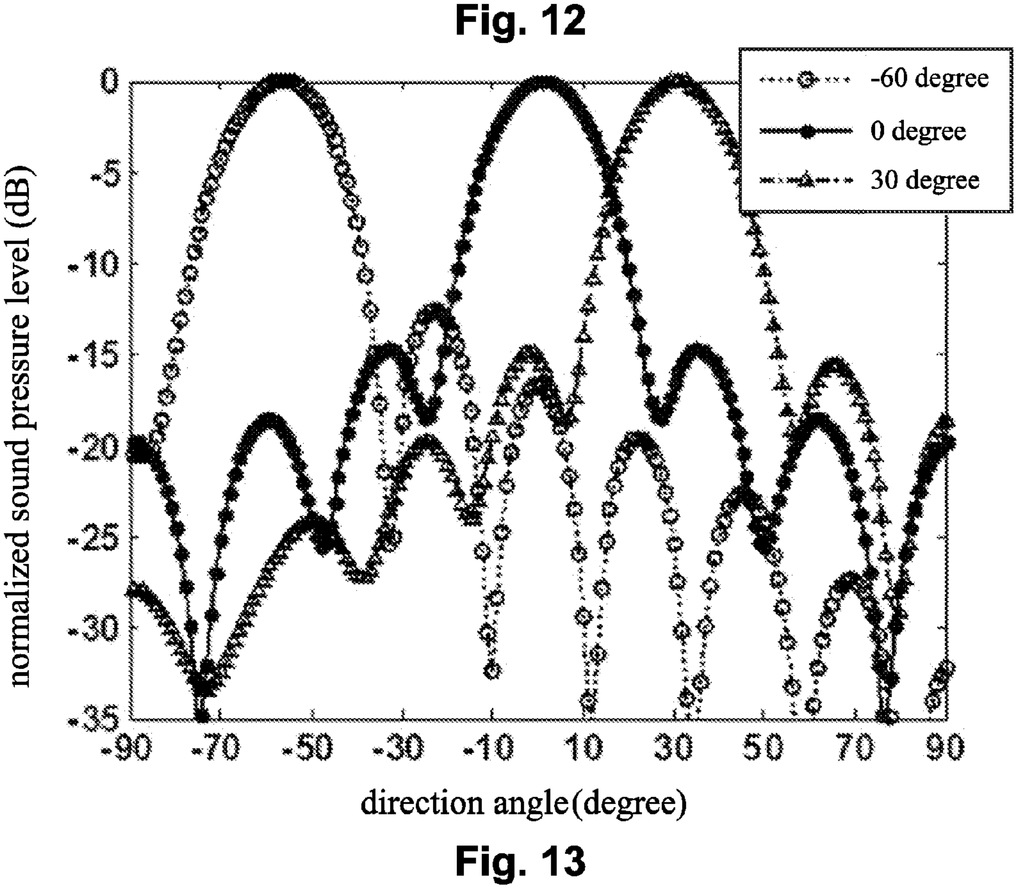
FIG. 13 is a graph illustrating the beam patterns generated in the three predetermined directions of −60 degree, 0 degree and +30 degree, according to one embodiment of the invention.

In the free space, in terms of the speaker array arrangement way as shown in FIG. 11, the simulation experiment of array beam controlling can be carried out according to the three predetermined beam main lobe directions of −60 degree, 0 degree and +30 degree, all the array lode width of the three circumstances is set as 20 degree. The spatial pattern of the array in the three predetermined directions is shown in FIG. 13, it can be seen from these graphs that the beam main lobe of the array points at the predetermined direction, the beam width reaches the desired demand, and the magnitude difference value between the main lobe and side lobe reaches 15 dB. It is known from the result of these array beam controlling that, utilizing the multi-channel information synthesis way of extraction selecting can succeed effectively the magnitude and phase adjustment information loaded on each channel by beam-former, thereby achieving the beam directionality control of array. This digital array beam-forming method based on extraction selecting can enhance the spatial directional ability of the digital array in complicated environment, and provide a reliable realizing way for the effect generation of the special sound field of the digital array, such as 3D stereo sound field, virtual surround sound field and directivity sound field etc.

It should be stated that the above embodiments are simply intended to illustrate the technical scheme of the invention, instead of limitation. Although the invention is described in detail with reference to the embodiment, it should be appreciated by those skilled in the art that any variations or equal replacements of the technical scheme of the invention are covered within the scope of the invention, without departing from the spirit and scope of the invention.

What is claimed is:

1. A method of channel equalization and beam controlling for a digital speaker array system, comprises steps of:

(1) converting digital format, to convert original signals into digital signals based on PCM coding;

(2) channel equalization processing;

(3) controlling beam-forming;

(4) performing multi-bit Σ-Δ modulation;

(5) thermometer code conversion, to convert low-bit PCM coded signals with a bit-width of M into unary code vectors of a digital power amplifier and a transducer load corresponding to $2^M$ transmission channels;

(6) dynamic mismatch-shaping processing, to reorder the thermometer coded vectors; and (7) extracting channel information, to send to the digital power amplifier and drive load sound, wherein the beam-forming in step (3) is controlled by a beam-former with a channel weight coefficient calculated by a regular method for beam-forming utilizing the following formula (1):

$$\hat{w} = \underset{w}{\operatorname{argmin}} \int_{\theta_1}^{\theta_2} \|w^T a(\theta) - D(\theta)\|^2 d\theta = \left(\int_{\theta_1}^{\theta_2} a(\theta)a(\theta)^T d\theta\right)^{-1} \int_{\theta_1}^{\theta_2} D(\theta)a(\theta)\, d\theta \qquad \text{Formula (1)}$$

wherein, $a(\theta)$ represents the spatial domain steering vector and $a(\theta)=[a_1(\theta)\ a_2(\theta)\ \ldots\ a_N(\theta)]^T$, N represents the elements number of array, and $D(\theta)$ represents the desired spatial domain beam configuration and $$D(\theta) = \begin{cases} 1, & \theta_1 \le \theta \le \theta_2 \\ 0, & \text{others} \end{cases}.$$

2. The method according to claim 1, wherein the original signals to be converted in step (1) are analog signals which in step (1) are firstly converted into digital signals based on PCM coding by analog-to-digital conversion, and then are converted in terms of parameter demands of a designated bit-width and a sampling rate into PCM coded signals meeting the parameter demands.

3. The method according to claim 1, wherein the original signals to be converted in step (1) are digital signals which in step (1) are converted into PCM coded signals in terms of parameter demands of a designated bit-width and a sampling rate.

4. The method according to claim 1, wherein the channel equalization in step (2) is processed by a equalizer with parameters obtained by measuring and calculation.

5. The method according to claim 1, wherein the process of the multi-bit Σ-Δ modulation in step (4) is as follows: interpolation filtering by an interpolation filter the high-bit PCM code after equalization processing according to a designated over-sampling factor, to obtain over-sampling PCM coded signals; and then performing Σ-Δ modulation to push the noise energy within audio bandwidth out of the audio band, thereby converting the high-bit PCM code into the low-bit PCM code.

6. The method according to claim 5, wherein the multi-bit Σ-Δ modulation in step (4) applies a noise-shaping treatment to the over-sampling signals output from the interpolation filter to push the noise energy out of the audio band by utilizing either higher-order single-stage serial modulation method or multi-stage parallel modulation method.

7. The method according to claim 1, wherein the code on each digit of the unary code vectors in step (5) is sent to the corresponding digital channel, the code on each digit having only two level states of "0" or "1" at any time wherein the transducer load being turned off when on the "0" state and being turned on when on the "1" state.

8. The method according to claim 1, wherein in the dynamic mismatch-shaping processing of step (6) shaping algorithms including DWA (Data-weighted Averaging), VFMS (Vector-Feedback mismatch-shaping) and/or TSMS (Tree-Structure mismatch shaping) are utilized to shape the nonlinear harmonic distortion frequency spectrum arisen from frequency response difference between array elements, for reducing the magnitude of the harmonic distortion components in band and pushing the power thereof to the high frequency section out of band.

9. The method according to claim 1, wherein the channel information extraction in step (7) performs a coded information distribution to each channel in which the signal processing is as follows: firstly the dynamic mismatch shaper of each channel performs the dynamic mismatch shaping to obtain reordered shaping vectors, and then a designated digit code is selected from the $2^M$ digits of the shaping vector of each channel as the output code of the channel according to a certain extraction selection rule, wherein in order to ensure the information being restored completely the number of the digit selected of one channel is different from that of other channels and all the digit numbers selected of all the $2^M$ channels contain the digit order of 1 to $2^M$ completely.

10. The method according to claim 9, wherein in the process of channel information extraction the digit selection is carried out in accordance with a simple rule of in No. i channel selecting No. i digit coded information from the shaping vector thereof.

11. The method according to claim 1, wherein the load to be driven in step (7) can be a digital speaker array including a plurality of speaker units, or a speaker unit having multiple voice-coil windings, or a digital speaker array containing a plurality of speaker units of multiple voice-coils.

12. A digital speaker array system having channel equalization and beam controlling functionalities, comprises:

a sound source, which is the information to be played by the system;

a digital converter, which is electrically coupled to the output end of the said sound source, for converting the input signals into high-bit PCM coded signals with a bit-width of N and a sampling rate off $f_s$;

a channel equalizer, which is electrically coupled to the output end of the digit converter, for performing an inverse filtering equalization on frequency response of each channel to eliminate frequency response fluctuation in band of the channel;

a beam-former, which is electrically coupled to the output end of the channel equalizer, for controlling the spatial domain emitting shape of the beam of speaker array and creating the sound field distribution characteristics to achieve the purpose of playing special sound effect;

a Σ-Δ modulator, which is electrically coupled to output end of said beam-former, for accomplishing over-sampling interpolation filtering and multi-bit Σ-Δ code modulation, to obtain low-bit PCM coded signals with a reduced bit-width;

a thermometer coder, which is electrically coupled to the output end of said Σ-Δ modulator, for converting the low-bit PCM coded signals into unary code vectors which is in amount equal to the digital channels of the system, thereby digitizing the control vectors of the channel switch;

a dynamic mismatch shaper, which is electrically coupled to the output end of said thermometer coder, for eliminating the nonlinear harmonic distortion components of spatial domain synthetic signals arisen from the frequency response difference between the array elements, reducing the magnitude of harmonic distortion components in band, and pushing the power of harmonic frequency components to the high frequency section out of band, thus reducing the magnitude of the harmonic distortion in band and improving the sound quality of the Σ-Δ coded signals;

an extraction selector, which is electrically coupled to said dynamic mismatch shaper, for extracting a certain digital coded information from the shaping vectors of each channel, and controlling the on/off action information of the channel;

a multi-channel digital amplifier, which is electrically coupled to said extraction selector, for amplifying power of the control coded signals of each channel, and driving the on/off action of the post-stage digital load; and a digital array load, which is electrically coupled to the output end of the multi-channel digital amplifier, for achieving the electro-acoustic conversion and converting the digital electric signals of switch into air vibration signals in analog format, wherein the beam-former uses a channel weight coefficient calculated by a regular method for beam-forming utilizing the following formula (1):

$$\hat{w} = \underset{w}{\operatorname{argmin}} \int_{\theta_1}^{\theta_2} \|w^T a(\theta) - D(\theta)\|^2 \, d\theta = \left(\int_{\theta_1}^{\theta_2} a(\theta)a(\theta)^T \, d\theta\right)^{-1} \int_{\theta_1}^{\theta_2} D(\theta)a(\theta)\, d\theta \qquad \text{Formula (1)}$$

wherein, a(θ) represents the spatial domain steering vector and $a(\theta)=[a_1(\theta)\ a_2(\theta)\ \ldots\ a_{N}(\theta)]^T$, N represents the elements number of array, and D(θ) represents the desired spatial domain beam configuration and $$D(\theta) = \begin{cases} 1, & \theta_1 \le \theta \le \theta_2 \\ 0, & \text{others} \end{cases}.$$

13. The system according to claim 12, wherein the sound source comprises analog signals or digit coded signals.

14. The system according to claim 12, wherein the digital converter contains an analog-to-digital converter, digital interface circuits, and interface protocol program.

15. The system according to claim 12, wherein the channel equalizer performs equalization processing in terms of the response parameters of inverse filtering in time domain or frequency domain, to eliminate the frequency response fluctuation in band of each channel and correct the frequency response difference of the channels.

16. The system according to claim 12, wherein the beam-former carries out weighted processing to the transmitted signals of each channel by utilizing the designed weighted vectors, to regulate the magnitude and phase information thereof.

17. The system according to claim 12, wherein the signal processing of the Σ-Δ modulator is as follows: at first the PCM coded signals with a bit-width of N and a sampling rate of $f_s$ are subjected to over-sampling interpolation filtering according to the over-sampling factor $m_o$ to obtain the PCM coded signals with a bit-width of N and a sampling rate of $m_o f_s$, and then the PCM coded signals with a bit-width of N are converted into low-bit PCM coded signals with a bit-width of M(M<N).

18. The system according to claim 12, wherein the Σ-Δ modulator performs noise shaping on the over-sampling signals output from the interpolation filter to push the noise energy out of band, in terms of higher-order single-stage serial modulator structure or multi-stage parallel modulator structure.

19. The system according to claim 12, wherein the thermometer coder is used for converting the low-bit PCM coded signals with a bit-width of M into unary code signal vectors of the digital amplifier and transducer load corresponding to $2^M$ channels, the code information of each digit of the unary code vectors being assigned to a corresponding digital channel to bring the transducer load into the signal coding flow and achieve digital coding and digital switch control for the transducer load.

20. The system according to claim 12, wherein the dynamic mismatch shaper utilizes shaping algorithms including DWA (Data-weighted Averaging), VFMS (Vector-Feedback mismatch-shaping) and/or TSMS (Tree-Structure mismatch shaping) to shape the nonlinear harmonic distortion frequency spectrum arisen from the frequency response difference between the array elements, to reduce the magnitude of the harmonic distortion components in band and push the power thereof to the high frequency section out of band, thus reducing the magnitude of the harmonic distortion in band.

21. The system according to claim 12, wherein the extraction selector extracts according to a certain extraction rule the information of one digit from the shaping vectors of each of $2^M$ digital channels as the output coded information of the corresponding channel, for controlling the on/off action of the post-stage transducer load.

22. The system according to claim 12, wherein the multi-channel digital amplifier sends the switch signals output from the extraction selector to the MOSFET grid end of a full-bridge power amplification circuit, thereby the on/off action of the circuit from power source to load being controlled by the on/off status of MOSFET.

23. The system according to claim 12, wherein the digital array load is a digital array comprising a plurality of speaker units, each digital channel of which consists of one or more speaker units; or a speaker unit of multiple voice-coils, each digital channel of which consists of one or more voice-coils; or an array of speakers of multiple voice-coils, each digital channel of which consists of multiple voice-coils and multiple speaker units.

24. The system according to claim 12, wherein the array configuration of the digital array load is arranged according to the quantity of transducer units and the practical application demand.

* * * * *